United States Patent [19]

Richter-Jörgensen

[11] Patent Number: 4,730,095

[45] Date of Patent: Mar. 8, 1988

[54] METHOD OF PRODUCING PLANAR ELECTRICAL CIRCUITS

[75] Inventor: Poul Richter-Jörgensen, Almunecar, Spain

[73] Assignee: Durgo AG, Switzerland

[21] Appl. No.: 889,365

[22] Filed: Jul. 25, 1986

[30] Foreign Application Priority Data

Jul. 25, 1985 [CH] Switzerland .................. 3230/85

[51] Int. Cl.⁴ ............................................. B23K 26/00
[52] U.S. Cl. ...................... 219/121 LM; 219/121 LT; 219/121 LS
[58] Field of Search .... 219/121 L, 121 LM, 121 LH, 219/121 LJ, 121 LS, 121 LT

[56] References Cited

U.S. PATENT DOCUMENTS

| | | | |
|---|---|---|---|
| 3,388,461 | 6/1968 | Lins | 219/121 LH X |
| 4,182,024 | 1/1980 | Cometta | 219/121 LH X |
| 4,184,062 | 1/1980 | Schmidt | 219/121 CH |
| 4,190,854 | 2/1980 | Redtern | 219/121 LH X |
| 4,377,736 | 3/1983 | Daunt et al. | 219/121 LH |
| 4,381,441 | 4/1983 | Desingrais et al. | 219/121 LH |

Primary Examiner—C. L. Albritton
Attorney, Agent, or Firm—Watson, Cole, Grindle & Watson

[57] ABSTRACT

The most essential of this novel production method of planar circuit or oscillating circuits is that the most important steps for extricating the conduit tracts on at least one electrically conductive layers is performed by laser beams, whereby already the initial reference points for the plurality of circuits to be produced are practically simultaneously applied by lasers and the application of the laser technique allows, furthermore, an exact correcting of the elements of the circuit by a simple reworking and highly precise circuits are formed which are extremely economically produced.

5 Claims, 6 Drawing Figures

METHOD OF PRODUCING PLANAR ELECTRICAL CIRCUITS

BACKGROUND OF THE INVENTION

1. Field of the Invention

The present invention relates to a method of producing a plurality of equal printed circuits on a common, planar insulating carrier of which at least one surface is provided with an electrically conducting layer, and relates specifically to such a method of producing oscillating circuits of which every one includes an electrical circuit closed in itself and having spirally arranged conductor tracts forming at least one induction coil and including at least one capacitor.

Accordingly, the present invention relates specifically to a novel method of producing such electrical oscillating circuits which the longer the more are used for specific applications in a large variety of industrial fields. Such electrical oscillating circuits are applied among others for a supervising and recognizing of moving objects in which the possibly emitted signals are utilized for an initiating of further process steps, e.g. control signals. If an electrical oscillating circuit or resonant circuit of mentioned structure and predetermined frequency is mounted to an object, such object can be monitored regarding its sequence of movements and be controlled accordingly.

An exemplary application is a controlling of railroad cars, specifically freight cars which are shunted via switches according to their specific points of destination.

The decisive point of such applications is that the oscillating circuits are at the one hand low cost items and, more important, feature at the other hand a high accuracy of frequency and excellent quality of the coil such that an erroneous sorting and mis-directions can be avoided with a high degree of accuracy.

The oscillating circuits under consideration regarding this invention are structured basically as follows:

On one surface of a planar carrier made of an electrically non-conductive material (a dielectric) there is provided a conductor spiral which is formed by spirally arranged conductor tracts which form the respective inductor coils of the oscillating circuit which in turn are electrically connected to one or several capacitors or one or several electrically conducting surfaces forming a respective portion of a capacitor. At the other side of the carrier correspondingly structured and planarly aligned electrically coonductive and mutually interconnected surfaces are provided which operate as the counterparts of the respective capacitor. The electrical conduits of the one of the sides are connected to those of the other side at a suitable point to complete the electrical circuit.

It has been mentioned above that the electrical conduit tracts of one of the sides act as induction coils of the oscillating circuit and that the larger conductive surfaces serve together with the corresponding surfaces of the other side and the intervening dielectric as capacitors. The complete electrical circuit, comprising the induction coils and one of the capacitors are tuned or adjusted, respectively to a predetermined receiving frequency. Oftentimes the oscillating circuits are designed such that a possibly further capacitor is tuned together with a corresponding induction coil to a so-called self-destructing frequency such that the oscillating circuit can be put out of order after an emitting of a signal (by emitting of energy having the self-destruction frequency which e.g. leads to a destruction of a point of connection in the electrical circuit).

So much regarding the general design of the known oscillating circuits under the present consideration.

It has been mentioned that a broad field of application of such oscillating circuits is only possible if these oscillating circuits made with a maximal operating precision (precision of frequency and quality of coils) can at the same time be manufactured at low cost.

Without any doubts as far as possible automatic series production is demanded. Such series production has, however, until now foundered due to the high demands regarding precision.

2. Description of the Prior Art

Methods of production according to which the circuit patterns are applied onto the carriers or the substrate, respectively by means of a screen printing or a photo engraving have not been successful regarding reaching the sought object due to economical considerations. Such methods are either too slow and demand highly qualified skilled personnel or are too complicated and require additionally specific chemical auxiliary agents.

A recently applied method utilized the etching technique for extricating electrical circuits. Such method allows a comparatively economical production in which a plurality of individual oscillating circuits can be produced simultaneously, indeed, but which requires the demanded highest precision or economical possibility, respectively regarding a later correcting of an oscillating circuit having a performance not within a set tolerance.

SUMMARY OF THE INVENTION

Hence it is an object of the present invention to provide a novel method of economically producing printed circuits and specifically of highest precision oscillating circuits.

A further object of the invention is to provide a method of producing planar electrical circuits comprising the steps (a) of applying by means of laser rays of a plurality of reference perforations on a sheet- or web-shaped composite body formed of an insulating carrier and a conducting layer applied on at least one side thereof, every individual of said perforations allocated to one respective circuit to be produced, the mutual distances between said perforations depending from the dimensions of the circuits to be produced, which perforations serve as reference points for the application of apparatuses for the performance of further working steps;

(b) of thereafter extricating the rough contours of the circuits at the conductive one or several conducting covering layers;

(c) of thereafter extricating by means of program or computer controlled laser rays; the conduit tracts at the one or several conductive layers which conduit tracks form the electrical circuits; and (d) of simultaneously or thereafter, in order to finalize the electrical circuit, determining the actual electrical values and comparing them with the design values, and in case of an exceedingly high deviation from the design values, performing the necessary corrections by an additional extricating e.g. by means of laser rays.

A further object is to provide a specific embodiment incorporating oscillating circuits of which every one comprises an electrical circuit closed in itself and including spirally arranged conduit tracts forming at least one induction coil and including at least one capacitor, and comprising the steps (a) of applying by means of laser rays a plurality of reference perforations on a sheet- or web-shaped composite body formed of an insulating carrier and an at least on one side thereof applied conducting layer, each individual of said perforations allocated to one respective oscillating circuit to be produced and the mutual distance of which depending from the dimensions of the circuits to be produced, which perforations serve as reference points for the application of apparatuses for the performance of further working steps;

(b) of thereafter extricating the rough contours of the oscillating circuits and of the intended capacitor surfaces at the at least one electrically conductive covering layers;

(c) of thereafter bringing the surfaces serving for the forming of the condensators to the final dimensions or in case of an electrically conductive layer present on one side only applying such separately on the reverse side, and extricating by means of program or computer respectively controlled laser rays the circuit tracts forming the oscillating circuit; and (d) of simultaneously or thereafter, in order to finally produce the oscillating circuits determining the actual electrical values and comparing such with the design values, and in case of an exceedingly high deviation from the design values performing the corresponding adjustments by an additional working e.g. by laser rays.

The reference perforations may be arranged along a rectilinear line or in form of a screen in shape of a network of coordinates. To this end preferably a plurality of simultaneously operating laser devices can be applied such as also can be made in case of the extrication of the conduit tracts.

The production control of the electrical circuits proceeds advantageously by a scanning thereof by means of probes in the course of which the scanned or measured values are compared with the design values in a computer which latter passes the necessary corrective signals on to a correcting or tuning laser apparatus.

Possibly necessary correction operations can be carried out by the same laser apparatus which extricate the conduit tracts.

BRIEF DESCRIPTION OF THE DRAWINGS

The invention will be better understood, and objects further than those set forth above, will become apparent when consideration is given to the following detailed description thereof when read in conjunction with the appended drawings and in which.

BRIEF DESCRIPTION OF A PREFERRED EMBODIMENT

Figure 1:
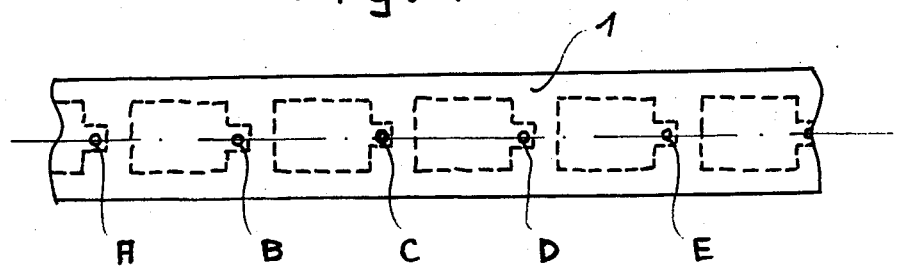
FIG. 1 illustrates a web-like foil including reference perforations arranged along a rectilinear line.

FIG. 1 of the drawings illustrates a web-shaped composite foil 1 which in accordance with the present invention has been provided with a plurality of reference perforations A-E. In the illustrated example these perforations have been bored in the center of the web-shaped foil along a rectilinear line and by means of a not specifically illustrated common industrial laser $L_1$. It has been mentioned above that the reference perforations are bored by means of an industrial laser apparatus $L_1$ and that the distance between the individual perforations can vary in dependency from the foreseen dimensions of the oscillating circuits to be produced.

These reference perforations serve as reference loci for the working application of all working apparatus to be used thereafter, i.e. for the working application of the working apparatus, devices, machines etc. for the subsequent production steps.

The highly true measurements of the reference points, not only in relation to each other but also of the perforation itself is a prerequisite regarding the final accuracy of the electrical values of the oscillating circuits. Laser-made perforations can be made with extremely highly true measurements and allow accordingly an orientation relative to the composite foil and further processing apparatus of exactly such precision. A computer is foreseen as part of the production plant. It controls the laser $L_1$ in the x-axis in case a plurality of oscillating circuits are to be produced not only consecutively, but also side by side whereby the composite foil is displaced e.g. by an uncoiler-coiler apparatus in the y-axis according to the intended dimensions of the desired oscillating circuits.

In place of one laser a plurality thereof can be installed by means of which the working times are shortened correspondingly because a plurality of perforations can be made simultaneously. The feeding time along the x-axis from perforation to perforation will be drastically reduced, too. Thus, a pattern of reference perforations is produced on the composite foil. These reference perforations can be coupled thereafter, e.g. by photoelectric cells to light barriers or be homed again by a laser or a series of lasers. Accordingly, a coordinate system has been produced on the composite foil.

Figure 2:
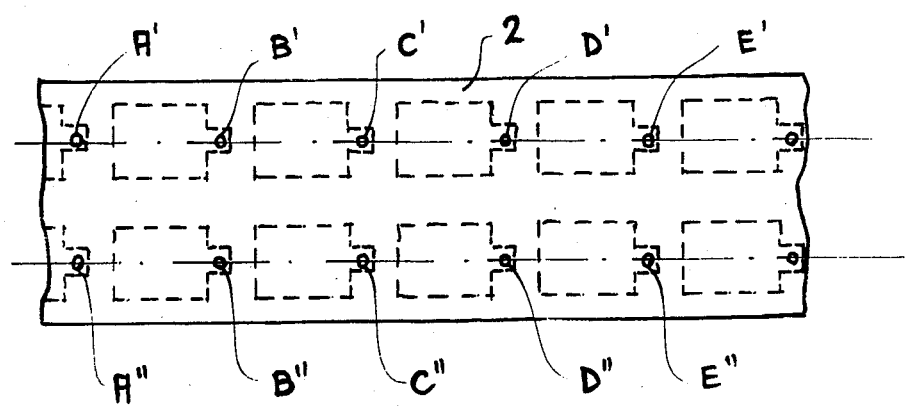
FIG. 2 illustrates a somewhat broader web-like composite foil on which a double row screen of reference perforations is provided.

FIG. 2 of the drawings illustrates a somewhat broader composite foil 2 in which two rows of reference perforations A'-E' and A"-E" have been applied by one or several lasers.

Commonly available laminates may be used as base material for the composite foil which must fulfill one condition only:

the electrically conducting cover layer is arranged on an insulating carrier or in case of two cover layers they are separated from each other by an insulating layer. Thereby, the cheapest composite foils are such as for instance used today in the packing industry. Combinations of aluminum/polyethylene (aluminium) or aluminium/polyester (aluminium) are available, whereby the insulating layer can consist of a polypropylene-, acetate- or other plastic foil. Thereby, the usual accuracy of measurements of the thickness of the metal- and insulation-layers of mentioned products is sufficient for the present purpose. The blanks may be a web of arbitrary length or may be processed as individual sheets which are fed via a magazine to the production process. The width of the web or of the individual sheets depends from the number of circuits or oscillating circuits, respectively which are to be produced parallel side-by-side.

Figure 3A:
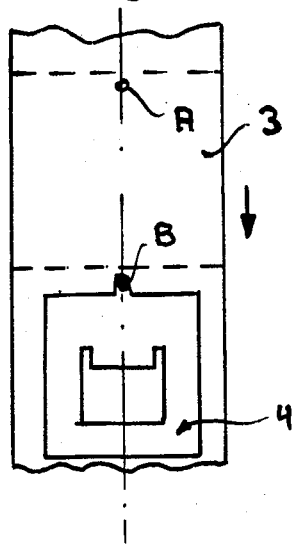
FIG. 3a-3d various steps of the method of production, schematically only and of only respective section of only one of a plurality of electrical circuits.
Figure 3B:
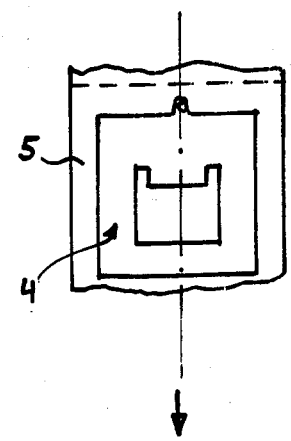

FIG. 3 of the drawings illustrates schematically only the next subsequent steps, namely FIG. 3a and 3b the second important step after the application of the reference perforations A, B etc., i.e.

the extricating of the rough outer contour 4 of the conducting cover layer 3 of the circuits, i.e. of the oscillating circuits and of the corresponding condensator parts. Such can proceed e.g. purely mechanically, such as by punching, machining or other suitable processing methods.

A specific suitable method is based on the known etching technique according to which initially (FIG. 3a) the areas of the electrically conducting covering layers corresponding to the rough contours of the circuits are masked e.g. by means of a printing ink (pattern type masking) and thereafter the rest of the conductive layers is removed from the insulating cover layer 5 (FIG. 3b).

Following these preparatory steps is the most important method step, namely extricating the electrically conductive layer 3 out of the remaining areas 4 by means of laser rays of an industrial laser $L_2$ (not shown). Thereby the prepared conductor layer 4 is "slit" by computer controlled laser rays.

In this way, in case of the producing of oscillating circuits an aluminium—or other metal—spiral is made. This spiral may be oval shaped, roughly angular or circular, depending from the given shape of the oscillating circuit. The laser $L_2$ is correspondingly controlled by the computer in the x/y-axis. The high cutting precision of laser rays which is sufficiently known in the industry is a further basis for the final precision of the sought oscillating circuit. Working processes such as stamping or etching cannot provide a comparable precision in series production methods. The detection of the oscillating circuits depends largely from the quality of the coils and exactness of the frequency. The quality of the coils depends in turn from the conductivity of the material; here silver could be preferred as the suitable material. However, considering economics, aluminium is quite sufficient. Further, the quality of the coils is strongly determined from the smoothness of the section areas of the conduit tracts relative to each other. All irregularities of the section areas relative to each other generate small local electric potentials which act in a reducing manner onto the induced electrical current in the complete coil 1, and thus influence negatively the signal of the oscillating circuit and the accordingly available possibility of recognition.

Laser cuts incorporate a high degree of smoothness of the cut section areas. It is this property which renders the application of the laser technology for mass-production of oscillating circuits extremely advantageous. The high cutting precision due to the high number of shots per unit of time, combined with commerically widespread available, i.e. cheap composite foils allows the production of highly precise oscillating circuits which are cheap enough to allow a use as mass marking means. By means of utilizing a plurality of adjacently located lasers $L_2$, all being controlled by the same computer a plurality of oscillating circuits can be produced simultaneously such that the economy is improved further still.

Figure 3D:
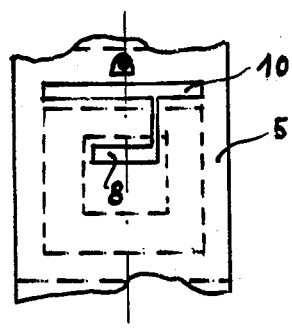
Figure 3C:
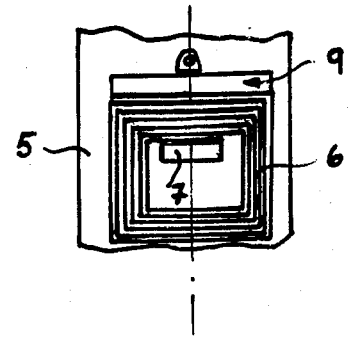

In the illustrated example no conductive layer is present on the reverse side of the composite foil. At a suitable production step, usually after the forming of the conduit tracts capacitor surfaces 8 corresponding to the capacitor surfaces 7 and coinciding therewith in planar shape and possible further circuit parts are mounted to the reverse side. Such circuit parts can be e.g. manufactured separately and be glued on or rolled on (FIG. 3d). It is also possible to extricate at the other side of the composite foil a capacitor surface 8 corresponding to the front capacitor surface 7 out of a conductive layer present at the other side. In order to close the circuit the circuit parts located at both sides of the composite foil will be interconnected electrically by known procedures, e.g. by interconnecting the conducting surfaces 9 and 10 via a suitable perforation through the insulating core.

The final production step, which in practice can be made simultaneously with the extricating of the conduit tracts refers to the checking or tolerance checking of the electrical design values. This may be done by a scanning of the oscillating circuit by means of a probe and comparing the electrical values by a computer with the design values.

A further laser $L_3$ (not shown) which is controlled by the computer corrects oscillating circuit and capacitor until the actual values correspond to the design values. Depending from the desired precision a tolerance band width can be programmed into the computer program and thus reducing the working time of the tuning or adjusting laser.

The above mentioned production steps may be carried out by several lasers which are controlled in parallel. This allows in turn a simultaneous balancing of several circuits. Furthermore, the working procedures of lasers $L_2$ and $L_3$ may be combined. In such case laser $L_s$ is controlled by the computer, produces the conduit tracts, and corrects oscillating circuit and capacitor until the desired design value is reached.

Due to the described method it is now possible to produce highly precise circuits, specifically highly precise oscillating circuits in a practically completely automated production extremely economically, i.e. at low cost.

At the end the finally produced, finished, checked and functionable oscillating circuits can be placed in the packings suitable for the intended performance. The individual oscillating circuits can be severed from each other from rolls as well as from sheets or they can be packed in form of webs or sheets. The reference perforations which were bored at the beginning of the production can be kept and be utilized e.g. as reference points for a printing. The oscillating circuits on webs can be provided on side with an adhesive and be covered at the other side by paper. The oscillating circuits may also be sealed into plastic shells and mounted to arbitrary objects by aid of a locking mechanism.

While there is described and shown a preferred embodiment of the present invention it shall be distinctly understood that such is for purpose of illustration and is not to be taken in a limiting way of the intended scope of protection such as set forth in the appended claims only.

What is claimed is:

1. A method of producing a plurality of equal printed circuits on a common, planar insulating carrier of which at least one side is provided with an electrically conducting layer for producing oscillating circuits of which every one comprises an electrical circuit closed in itself and including spirally arranged conduit tracts forming at least one induction coil and including at least one capacitor, comprising the steps of:
   (a) applying by means of laser rays a plurality of reference perforations on at least one of a sheet and web-shaped composite body formed of an insulating carrier and at least on one side thereof an applied conducting layer, each individual one of said perforations being allocated to one respective oscillating circuit to be produced and the mutual distances of which depending from the dimensions of the circuits to be produced, which perforations serve as reference points for the application of apparatus for the performance of further working steps;

(b) thereafter extricating the rough contours of the oscillating circuits and of the intended capacitor surfaces at the at least one electrically conductive covering layers;

(c) thereafter bringing the surfaces serving for the forming of the capacitors to the final dimensions and extricating, by means of at least one of a program and computer controlled laser rays, the circuit tracts forming the oscillating circuit; and (d) to finally produce the oscillating circuits determining the actual electrical values and comparing such with the design values to carry out corresponding adjustments by an additional working by laser rays.

2. The method of claim 1, wherein said reference perforations are formed along a rectilinear line.

3. The method of claim 1, wherein said reference perforations are formed in a two dimensional pattern in the form of a system of coordinates.

4. The method of claim 1, wherein a plurality of simultaneously operating laser apparatus are used for forming said reference perforations and/or said conduit tracts.

5. The method of claim 1, wherein the adjusting operations are performed by the same lasers which extricate the conduit tracts.

* * * * *